(12) United States Patent
Ramaswamy et al.

(10) Patent No.: US 9,401,476 B2
(45) Date of Patent: Jul. 26, 2016

(54) METHODS OF FORMING MEMORY STRUCTURES

(71) Applicant: Micron Technology, Inc., Boise, ID (US)

(72) Inventors: Durai Vishak Nirmal Ramaswamy, Boise, ID (US); Mark S. Korber, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/853,775

(22) Filed: Sep. 14, 2015

(65) Prior Publication Data

US 2016/0005968 A1    Jan. 7, 2016

Related U.S. Application Data

(62) Division of application No. 13/340,375, filed on Dec. 29, 2011, now Pat. No. 9,136,306.

(51) Int. Cl.
*H01L 27/24* (2006.01)
*H01L 45/00* (2006.01)

(52) U.S. Cl.
CPC ........ *H01L 45/1666* (2013.01); *H01L 27/2409* (2013.01); *H01L 27/2418* (2013.01); *H01L 27/2463* (2013.01); *H01L 45/08* (2013.01); *H01L 45/1233* (2013.01); *H01L 45/146* (2013.01); *H01L 45/147* (2013.01); *H01L 45/1683* (2013.01)

(58) Field of Classification Search
CPC ............ H01L 27/2409; H01L 27/2416; H01L 27/2463; H01L 45/00; H01L 45/1666
See application file for complete search history.

(56) References Cited

U.S. PATENT DOCUMENTS

| | | | |
|---|---|---|---|
| 5,831,276 | A | 11/1998 | Gonzalez et al. |
| 6,801,450 | B2 | 10/2004 | Perner |
| 7,704,825 | B2 | 4/2010 | Yamada |
| 7,830,697 | B2 | 11/2010 | Herner |
| 7,838,341 | B2 | 11/2010 | Dennison |
| 7,981,773 | B2 | 7/2011 | Krieger et al. |
| 2009/0303772 | A1 | 12/2009 | Rinerson et al. |
| 2010/0078758 | A1 | 4/2010 | Sekar et al. |
| 2012/1004352 | | 2/2012 | Schloss et al. |

*Primary Examiner* — Matthew Reames
(74) *Attorney, Agent, or Firm* — Wells St. John P.S.

(57) ABSTRACT

Some embodiments include memory structures having a diode over a memory cell. The memory cell can include programmable material between a pair of electrodes, with the programmable material containing a multivalent metal oxide directly against a high-k dielectric. The diode can include a first diode electrode directly over one of the memory cell electrodes and electrically coupled with the memory cell electrode, and can include a second diode electrode laterally outward of the first diode electrode and not directly over the memory cell. Some embodiments include memory arrays comprising the memory structures, and some embodiments include methods of making the memory structures.

20 Claims, 12 Drawing Sheets

US 9,401,476 B2

METHODS OF FORMING MEMORY STRUCTURES

RELATED PATENT DATA

This patent resulted from a divisional of U.S. patent application Ser. No. 13/340,375 filed on Dec. 29, 2011, now issued as U.S. Pat. No. 9,136,306, which is hereby incorporated by reference herein.

TECHNICAL FIELD

Memory structures and arrays, and methods of forming memory structures and arrays.

BACKGROUND

Memory is often incorporated into integrated circuitry. The memory may be used, for example, in computer systems for storing data.

Memory may be fabricated as an array of individual memory cells, with each memory cell being configured to retain or store memory in at least two different selectable states. In a binary system, the storage conditions are considered as either a "0" or a "1".

One type of memory cell is a so-called cross-point memory cell, which comprises two electrically conductive electrodes having a programmable material received between them. Such memory cells may be incorporated into Resistive Random Access Memory (RRAM).

A difficulty in utilizing cross-point memory is that there can be substantial leakage of current through the cross-point memory cells, and such may adversely lead to errors during retrieval of stored data from a memory array. Accordingly, diodes or other select devices are commonly paired with the memory cells to assist in control of current through the memory cells. A memory cell paired with a select device may be referred to as a memory structure.

It desired to develop improved memory structures, and improved methods of forming memory structures.

DETAILED DESCRIPTION OF THE ILLUSTRATED EMBODIMENTS

Some embodiments include new memory structures and new methods of forming memory structures. Example embodiments are described with reference to FIGS. 1-14.

Figure 1:
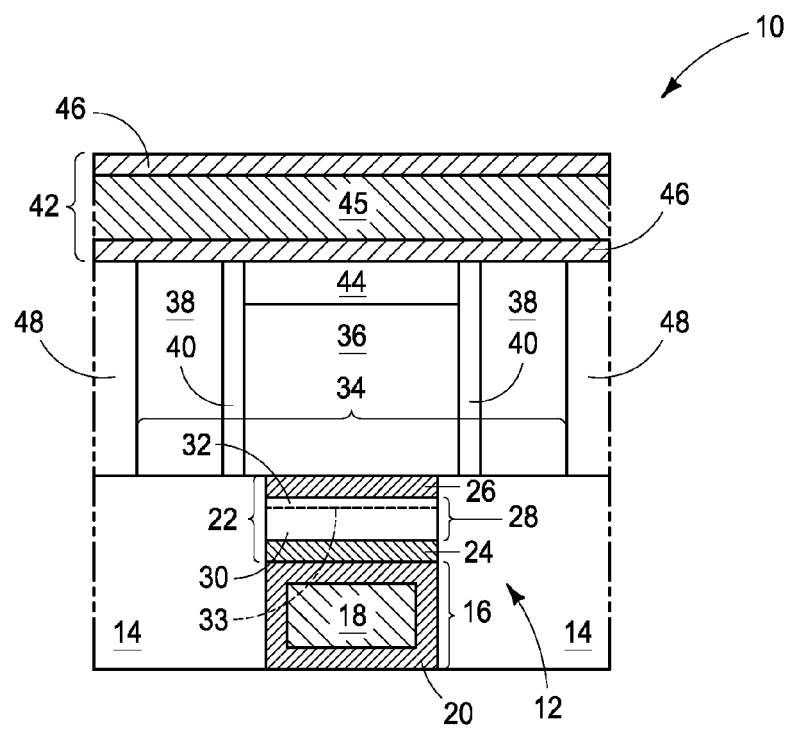
FIG. 1 is a diagrammatic cross-sectional view of a portion of a semiconductor construction comprising an example embodiment memory structure.

Referring to FIG. 1, a construction 10 is shown to comprise an example embodiment memory structure 12.

The construction 10 includes an electrically insulative (i.e., dielectric) material 14. Such electrically insulative material may comprise any suitable composition or combination of compositions; and in some embodiments may comprise, consist essentially of, or consist of silicon nitride.

An access/sense line 16 extends through electrically insulative material 14, and in the shown embodiment such access/sense line extends in and out of the page relative to the cross-sectional view of FIG. 1.

The access/sense line may be, for example, a wordline or a bitline; and may comprise any suitable electrically conductive composition or combination of compositions. In the illustrated embodiment, the access/sense line comprises a copper-containing core 18 surrounded by copper barrier material 20. The core 18 may comprise, consist essentially of, or consist of copper. The barrier material 20 may comprise any composition suitable to preclude copper migration from core 18 into other materials of construction 10. In some embodiments, the barrier material may be a ruthenium-containing material.

The electrically insulative material 14 may be supported over a semiconductor base (not shown). The base may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. In some embodiments, the base may correspond to a semiconductor substrate containing one or more materials associated with integrated circuit fabrication. In such embodiments, such materials may correspond to one or more of refractory metal materials, barrier materials, diffusion materials, insulator materials, etc.

A memory cell 22 is over the access/sense line 16. The memory cell comprises a pair of electrically conductive electrodes 24 and 26, and comprises programmable material 28 between the electrodes.

Electrodes 24 and 26 may comprise any suitable electrically conductive materials, and may be the same composition as one another or may differ in composition from one another. In some embodiments, the electrodes 24 and 26 may comprise a noble metal, such as, for example, platinum or palladium.

The programmable material 28 comprises a multivalent metal oxide 30 directly against a high-k dielectric 32. A dashed line 33 is provided to diagrammatically illustrate a boundary between the multivalent metal oxide and the high-k dielectric. The high-k dielectric is a different composition from the multivalent metal oxide; and thus the high-k dielectric and multivalent metal oxide together form discrete layers of a multi-layer programmable material (e.g., the illustrated dual-layer programmable material 28). In some embodiments, the high-k dielectric and the multivalent metal oxide may both be oxides, and the memory cell 22 may be programmed by moving oxygen species (for instance, oxygen ions) within and between such oxides.

The multivalent metal oxide may comprise any suitable composition, including, for example, one or more of barium, ruthenium, strontium, titanium, calcium, manganese, praseodymium, lanthanum and samarium. In some embodiments, the multivalent metal oxide may comprise calcium manganese oxide doped with one or more of Pr, La, Sr and Sm. For instance, the multivalent metal oxide may comprise, consist essentially of, or consist of a material known as PCMO (praseodymium calcium manganese oxide).

The high-k dielectric may comprise any suitable composition; and in some embodiments may comprise an oxide which includes one or more of hafnium, zirconium, yttrium, and aluminum.

Although the high-k dielectric is shown over the multivalent metal oxide in the embodiment of FIG. 1, in other embodiments the order of the high-k dielectric and the multivalent metal oxide may be reversed so that the multivalent metal oxide is over the high-k dielectric.

The construction of FIG. 1 further comprises a diode 34 over the memory cell. The diode comprises a first diode electrode 36, a second diode electrode 38, and an intermediate diode region 40. In the shown embodiment, the first diode electrode 36 is directly over, and directly against, an upper surface of the uppermost electrode 26 of memory cell 22; and the second diode electrode 38 and the intermediate diode region 40 are not directly over the memory cell 22. The intermediate diode region 40 of the shown embodiment comprises a pair of segments which are on opposing sides of the first diode electrode 36 relative to one another, and which are laterally outward of the first diode electrode. The second diode electrode 38 of the shown embodiment also comprises a pair of segments which are on opposing sides of the first diode electrode 36 from one another. The segments of the diode electrode 38 are laterally outward of the segments of the intermediate diode region 40. The illustrated relative sizes of the intermediate diode region 40 and the diode electrodes 36 and 38 pertain to an example embodiment. Any suitable sizes of the intermediate diode region 40 and the diode electrodes 36 and 38 may be utilized, and other embodiments may have other relative sizes than are illustrated in FIG. 1. Similarly, the illustrated relative sizes of other features shown in FIG. 1, or shown in any of the other figures of this application, may be varied in other example embodiments which are not shown.

The diode electrodes 36 and 38, and the intermediate diode region 40, may comprise any suitable compositions. Also, the diode 34 may comprise any of numerous diode configurations; including, for example, PIN (p-type/intrinsic/n-type), MIM (metal/insulator/metal), MIIM (metal/insulator$_1$/insulator$_2$/metal), etc.

In some embodiments, the diode may comprise electrodes 36 and 38 which are the same composition as one another (for instance, both diodes may comprise, consist essentially of, or consist of titanium nitride) and the intermediate diode region 40 may comprise, consist of, or consist of appropriately-doped semiconductor material. For instance, the diode region 40 may comprise one or more p-type doped domains and one or more n-type doped domains. In such embodiments, the semiconductor material of region 40 may comprise, for example, silicon and/or germanium.

The diode 34 together with the memory cell 22 forms the memory structure 12. The construction 10 comprises an access/sense line 42 over the diode 34; with such access/sense line being electrically coupled with the second electrode 38 of the diode. The access/sense line 42 is not directly electrically coupled with the first diode electrode 36, but instead is spaced from the first diode electrode 36 by a dielectric material 44. Such dielectric material may comprise any suitable composition; and in some embodiments may comprise, consist essentially of, or consist of silicon nitride.

The access/sense line 42 comprises a copper-containing core 45 and a copper barrier material 46. The core 45 may comprise, consist essentially of or consist of copper; and the barrier material 46 may comprise compositions of the type described above with reference to the copper barrier material 20.

The access/sense lines 16 and 42 may be referred to as first and second access/sense lines, respectively, to distinguish such access/sense lines from one another. In some embodiments, the access/sense line 16 may correspond to a wordline, and the access/sense line 42 may correspond to a bitline. In the shown embodiment the access/sense line 42 extends along the cross-section of FIG. 1, and substantially orthogonally to the access/sense line 16 (which extends in and out of the page relative to the cross-section of FIG. 1).

Dielectric material 48 is shown to be laterally outward of the second diode electrode 38, and may be utilized to electrically isolate the second diode electrode 38 from other integrated circuit components (not shown). For instance, the illustrated structure 12 may be part of a large array of memory structures, and the dielectric material 48 be utilized to electrically isolate adjacent memory structures from one another. The dielectric material 48 may comprise any suitable composition or combination of compositions, and in some embodiments may comprise, consist essentially of, or consist of silicon nitride.

Figure 2:
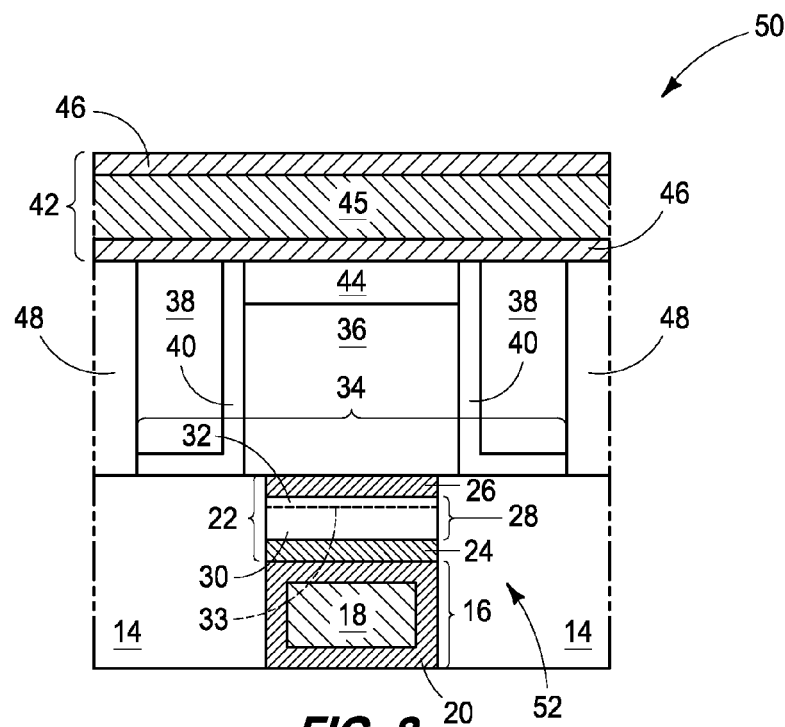
FIG. 2 is a diagrammatic cross-sectional view of a portion of a semiconductor construction comprising another example embodiment memory structure.

FIG. 2 shows a construction 50 illustrating another example embodiment memory structure 52. Identical numbering will be utilized to describe the embodiment of FIG. 2 as is used above to describe the embodiment of FIG. 1, where appropriate. The construction of FIG. 2 is identical to that of FIG. 1, except that the intermediate diode region 40 extends to under the second diode electrode 38. There may be methodological advantages to forming the construction of FIG. 2 relative to that of FIG. 1, or vice versa, in some applications.

Figure 3:
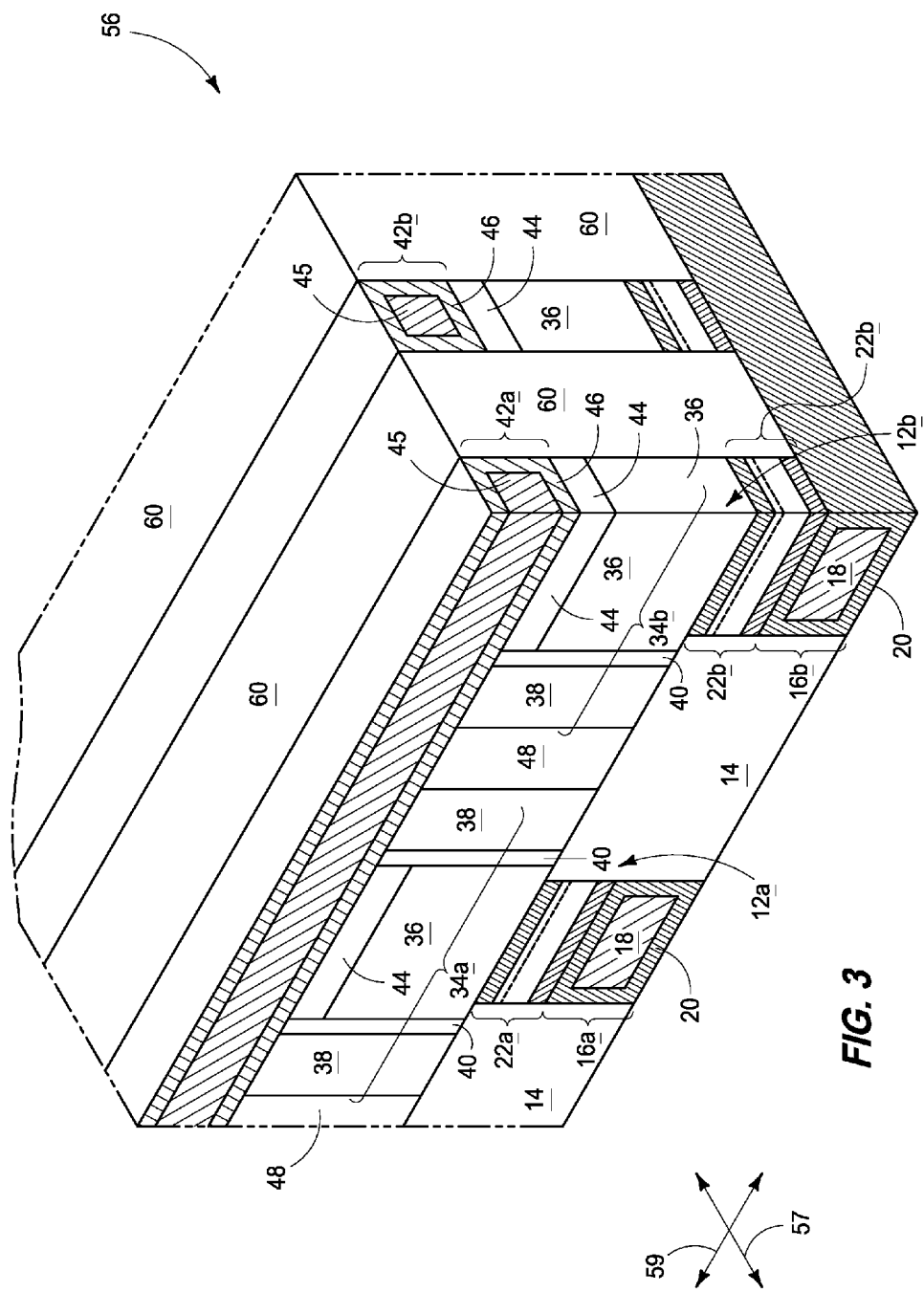
FIG. 3 is a diagrammatic three-dimensional view of a portion of a semiconductor construction comprising an example embodiment array of memory structures.

FIG. 3 shows a portion of a construction 56 comprising an array of the memory structures 12 described above with reference to FIG. 1 (a pair of individual memory structures are labeled as 12a and 12b). Such array comprises cross-point memory cells, and thus may be scalable for high-density applications. The array may comprise any suitable number of memory structures, including hundreds, millions, etc., of memory structures depending on a desired storage capacity of the memory array.

The construction 56 comprises a first series of access/sense lines (with lines of the first series being labeled as 16a and 16b) extending primarily along a first direction (with the first direction being along an axis labeled 57), and comprises a second series of access/sense lines (with the lines of the second series being labeled as 42a and 42b) extending primarily along a second direction (with the second direction being along an axis labeled 59). The second direction intersects the first direction, and in the shown embodiment is substantially orthogonal to the first direction. The lines of the first and second series are shown to be straight, but such lines may be curved or wavy in other embodiments.

The memory structures 12a and 12b are provided at regions where lines of the second series overlap lines of the first series. The individual memory structures comprise memory cells (with the memory cell of structure 12a being labeled as 22a, and with the memory cell of structure 12b being labeled as 22b). The individual memory structures also comprise diodes (with the diode of memory structure 12a being labeled as 34a, and with the diode a structure 12b being labeled as 34b).

Electrically insulative material 60 is provided between access/sense lines 42a and 42b, and extends downwardly through the materials of the memory cell structures 12*a* and 12*b* to form electrical isolation between adjacent memory cell structures. The electrically insulative material 60 may comprise any suitable composition or combination of compositions; and in some embodiments may comprise, consist essentially of, or consist of silicon nitride.

An example method of forming an array of memory structures is described with reference to FIGS. 4-13. In referring to FIGS. 4-13, similar numbering will be used as is used above to describe FIGS. 1-3, where appropriate.

Figure 4:
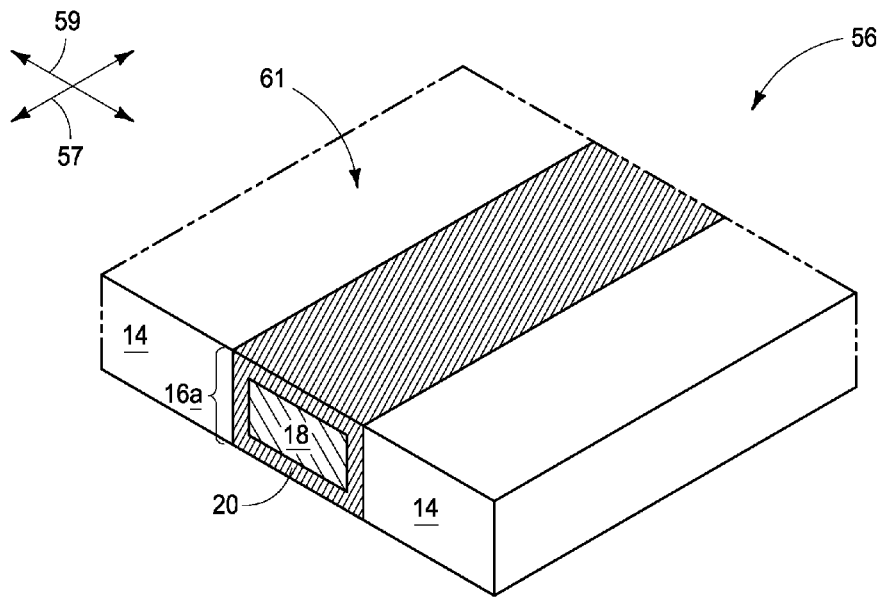
FIGS. 4-13 are diagrammatic three-dimensional views of a portion of a semiconductor construction shown at various stages of an example embodiment method of forming an array of memory structures.

Referring to FIG. 4, construction 56 is shown at a processing stage after the access/sense line 16*a* has been formed to extend through the electrically insulative material 14. The access/sense line may be formed with any suitable processing. For instance, a trench may be formed within material 14, and the access/sense line materials may be then formed within such trench. Chemical-mechanical planarization (CMP) may be utilized to form the illustrated planarized upper surface 61 extending across material 14 and access/sense line 16*a*. The access/sense line 16*a* extends primarily along the direction of axis 57.

Figure 5:
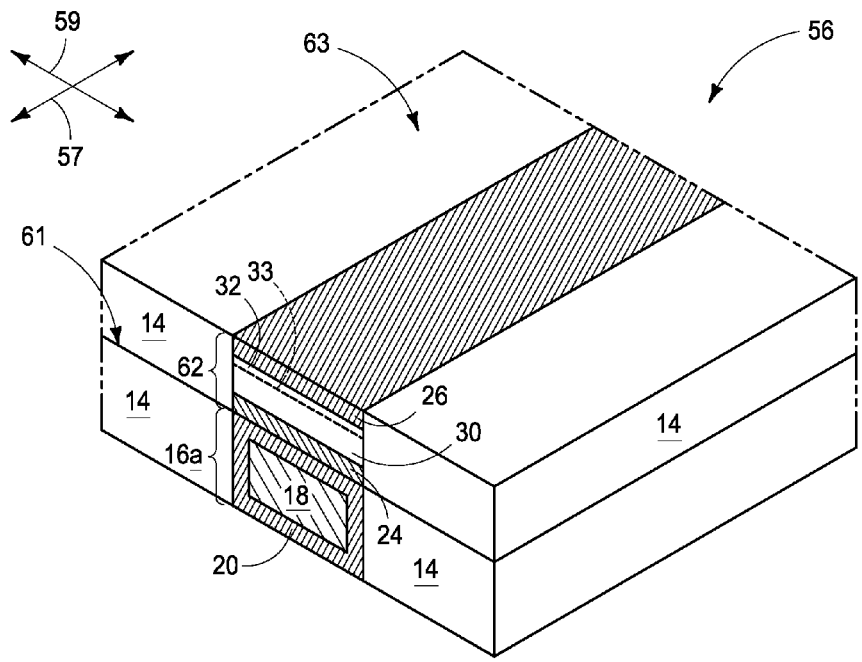

Referring to FIG. 5, additional insulative material 14 is formed over planarized surface 61, and a stack of memory cell materials is formed over the access/sense line 16*a* (with the memory cell materials comprising the materials of electrodes 24 and 26, and the programmable materials 30 and 32). In some embodiments, insulative material 14 may be formed as an expanse across surface 61, a trench may be formed within such expanse over the access/sense line 16*a*, and then the memory cell materials may be formed within such trench. CMP may be subsequently utilized to form a planarized upper surface 63 extending across material 14 and the material of electrode 26.

In other embodiments, the stack of memory cell materials may be initially formed and patterned into a line extending along access/sense line 16*a*, then material 14 may be subsequently formed over and along such line, and then CMP may be utilized to form the construction 56 of FIG. 5. In yet other embodiments, a deeper trench may be formed at the processing stage of FIG. 4 than is shown, and the access/sense line may be formed within such trench followed by formation of the memory cell materials over the access/sense line within the same trench to create the construction 56 shown in FIG. 5. In embodiments in which the access/sense line is formed within a first level of insulative material, and the memory cell materials are formed within a second level of insulative material, the insulative materials of the first and second levels may be the same as one another (as shown, where both of the insulative materials are labeled as 14), or may be different from one another.

The stack of memory cell materials (i.e., the stack comprising the materials of electrodes 24 and 26, together with the programmable materials 30 and 32) may be considered to form a rail 62. Such rail extends primarily along the direction of axis 57 and is directly over and directly against the access/sense line 16*a* in the shown embodiment.

Figure 6:
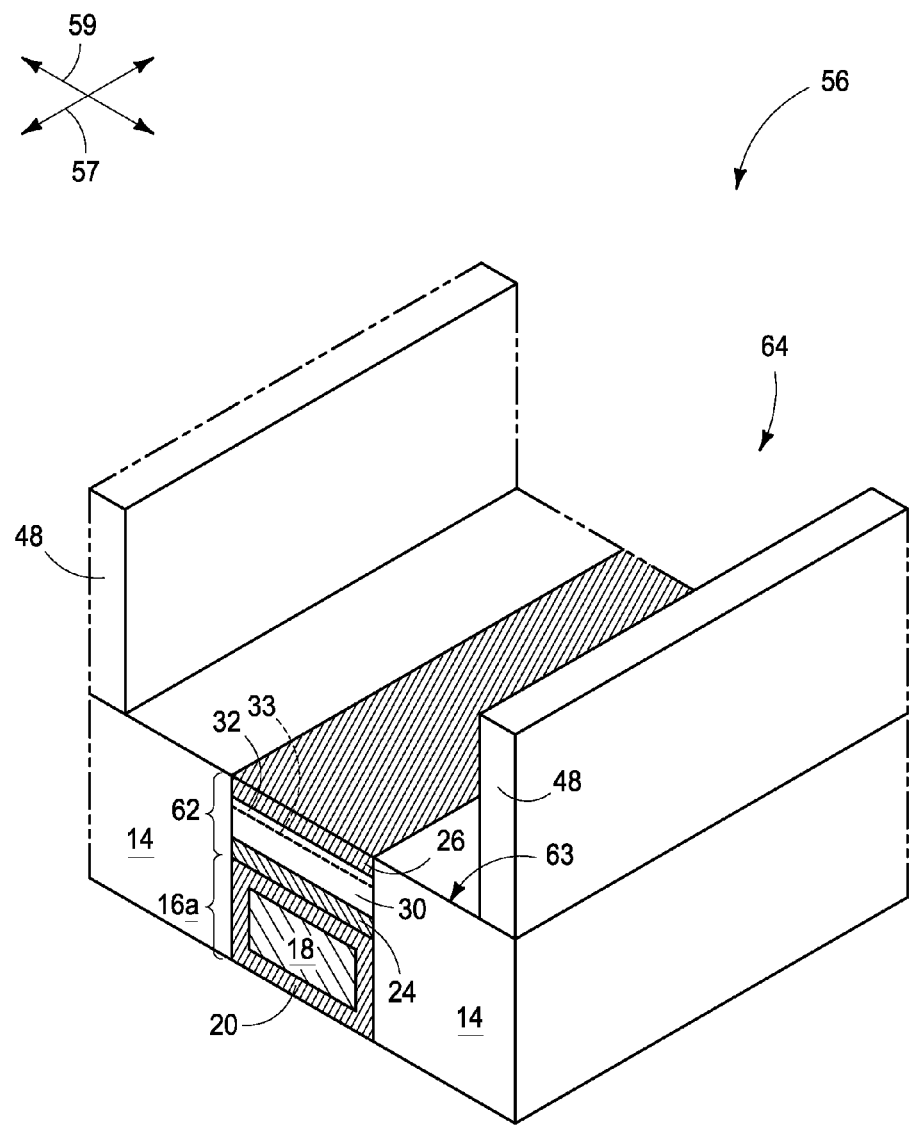

Referring to FIG. 6, electrically insulative material 48 is formed over planarized surface 63, and then patterned to form a trench 64 over the first rail 62. The electrically insulative 48 may comprise a same composition as material 14, or may comprise a different composition from material 14. An upper surface of the rail 62 (specifically, an upper surface of the top electrode 26) is exposed along a bottom of trench 64.

Figure 7:
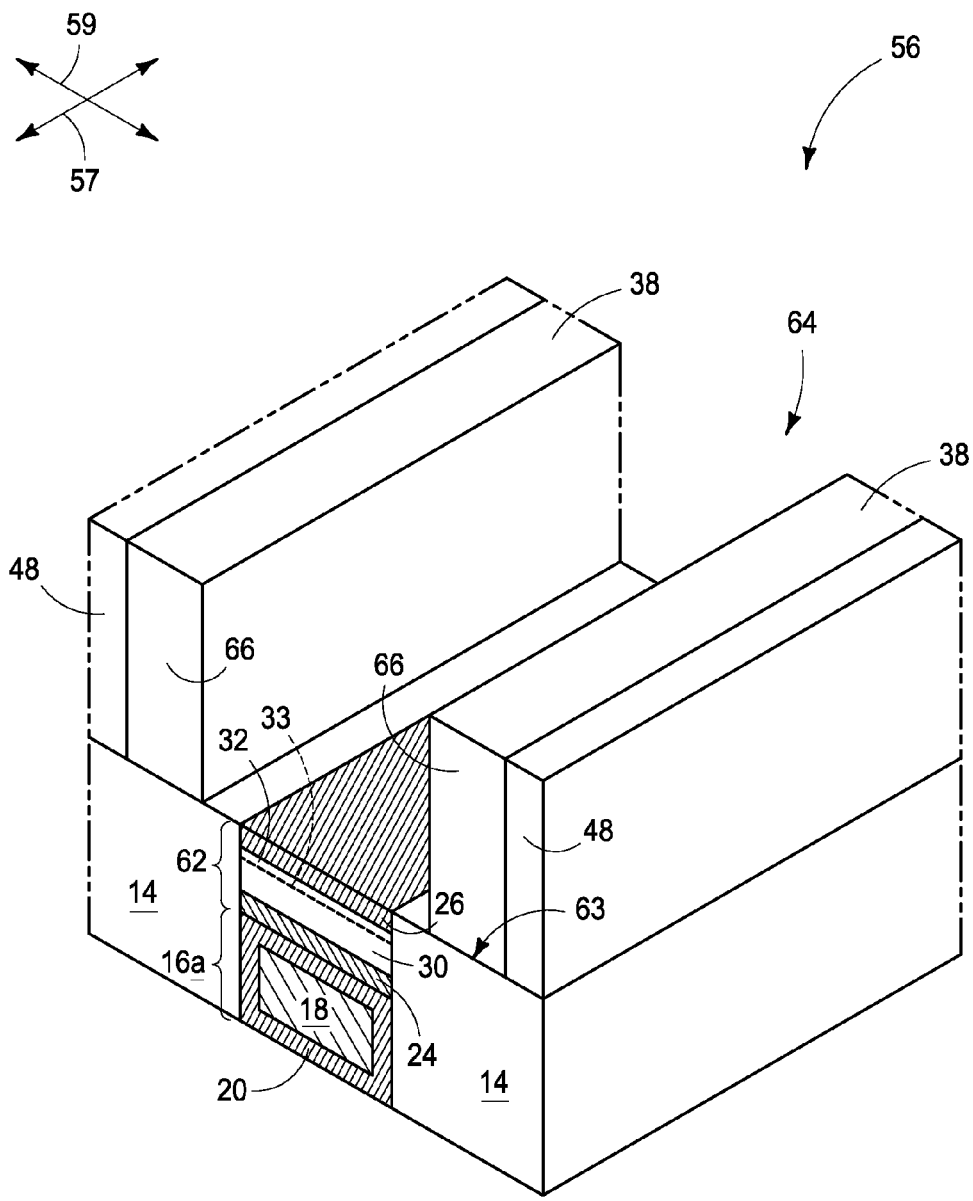

Referring to FIG. 7, outer diode electrode material 66 is formed within trench 64, and patterned to form the outer diode electrode 38 as liners along sidewalls of the trench. The liners of outer diode electrode 38 narrow trench 64.

In some embodiments, diode electrode material 66 may be formed as a layer that extends along sidewalls of trench 64 and along the bottom of the trench, and may be subjected to anisotropic etching to form the diode electrode material into the patterned liners (i.e., segments) of diode electrode 38 along the sidewalls of the trench. The segments of diode electrode 38 are laterally outward of the upper surface of the memory cell electrode 26 so that an entirety of the upper surface of such memory cell electrode is exposed between such segments.

Figure 8:
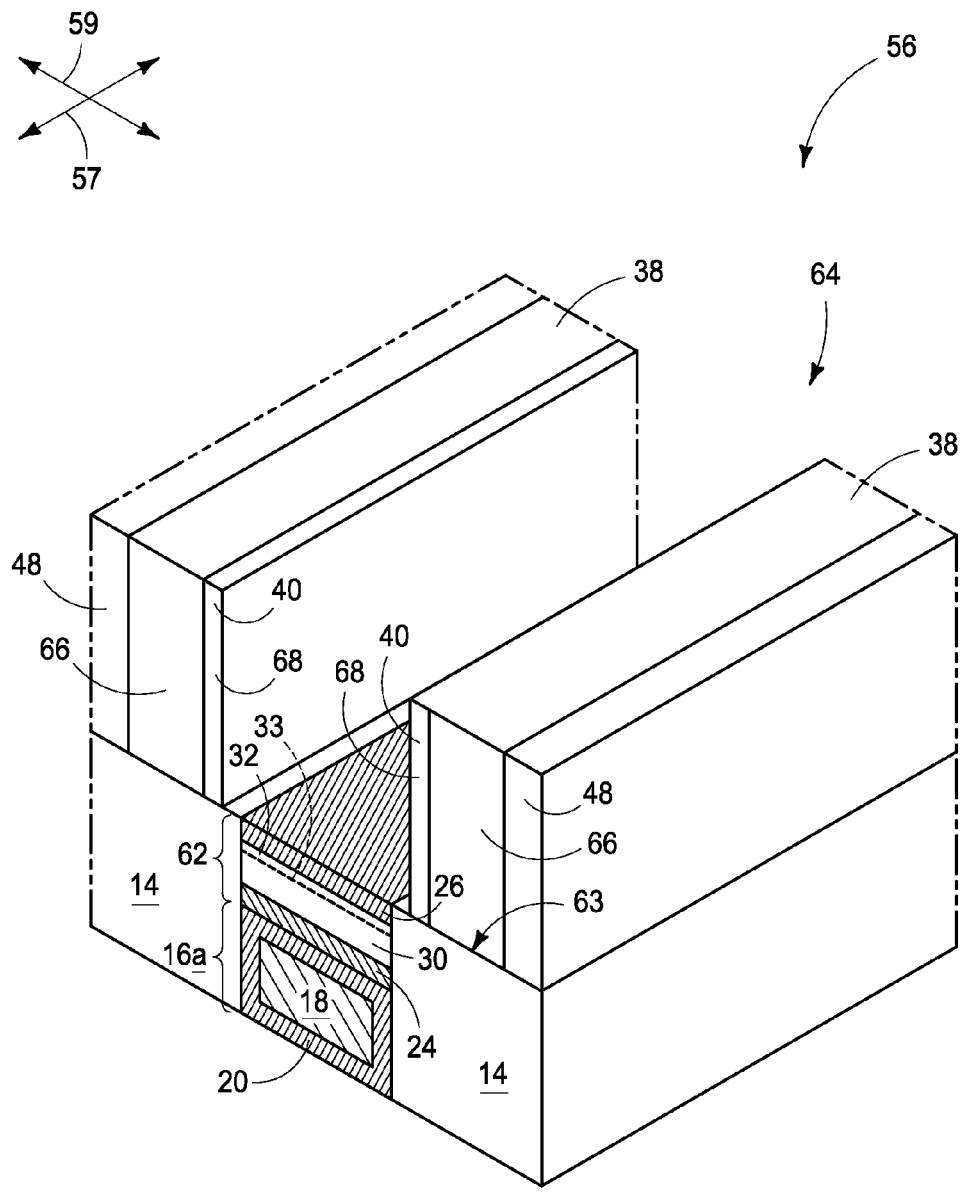

Referring to FIG. 8, intermediate diode material 68 is formed within narrowed trench 64, and patterned to form the intermediate diode region 40 as liners (i.e., segments) along sidewalls of the narrowed trench (and specifically along the segments of outer diode electrode 38). The intermediate diode material may comprise any suitable composition; and in some embodiments may comprise semiconductor material (for instance, silicon and/or germanium) doped with appropriate dopant to have one or more p-type domains and/or one or more n-type domains. In other example embodiments, the intermediate diode material may comprise silicon and carbon; zirconium oxide; nickel oxide; and/or any other suitable composition.

In some embodiments, intermediate diode material 68 may be formed as a layer that extends along sidewalls of narrowed trench 64 and along the bottom of the narrowed trench, and may be subjected to anisotropic etching to form the intermediate diode material into the patterned segments of intermediate diode region 40 along the sidewalls of the narrowed trench. The segments of the intermediate diode region 40 are laterally outward of the upper surface of the memory cell electrode 26 so that the entirety of the upper surface of such memory cell electrode is exposed between such segments.

Figure 9:
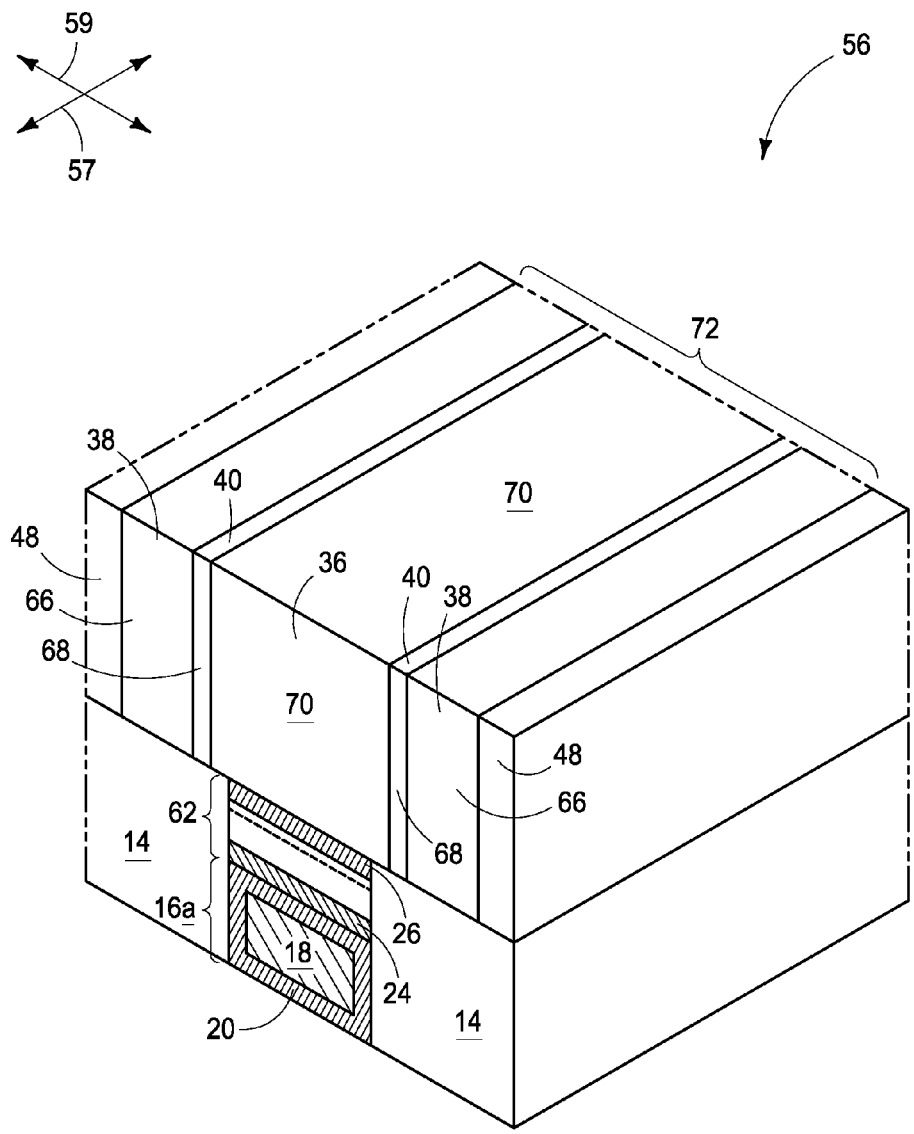

Referring to FIG. 9, diode electrode material 70 is formed within trench 64 (FIG. 8). The diode electrode material 70 forms the diode electrode 36. The diode electrode material 70 may comprise a same composition as diode electrode material 66 or a different composition. In some embodiments, both of diode electrode materials 66 and 70 comprise metal; and in some embodiments both of the diode electrode materials may comprise, consist essentially of, or consist of titanium nitride. In other example embodiments, one or both of the diode electrode materials may comprise ruthenium and carbon; titanium, aluminum and nitrogen; doped semiconductor material; or any other suitable composition.

The diode electrode material 70 may be referred to as an inner diode electrode material to distinguish it from the outer diode electrode material 66. The inner diode electrode material 70 is directly over and directly against the upper surface of the memory cell electrode 26.

In some embodiments, the diode materials 66, 68 and 70 may be considered together as a second rail 72 which is over the first rail 62. The second rail extends along the direction of axis 57.

Figure 10:
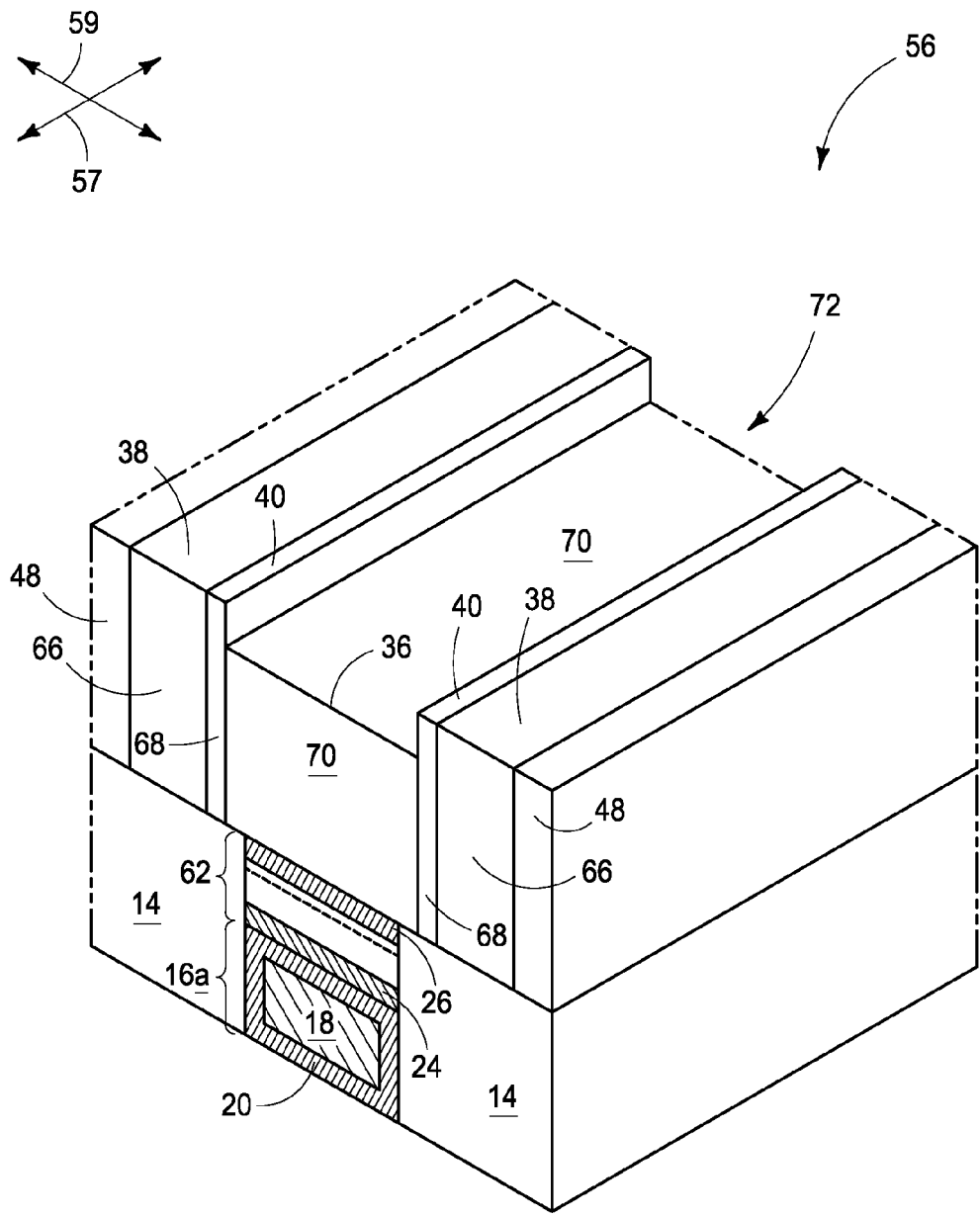

Referring to FIG. 10, the inner diode electrode material 70 is recessed within trench 64 (FIG. 8) to form a groove 72 above the inner diode electrode material and between the liners of intermediate diode material 68.

Figure 11:
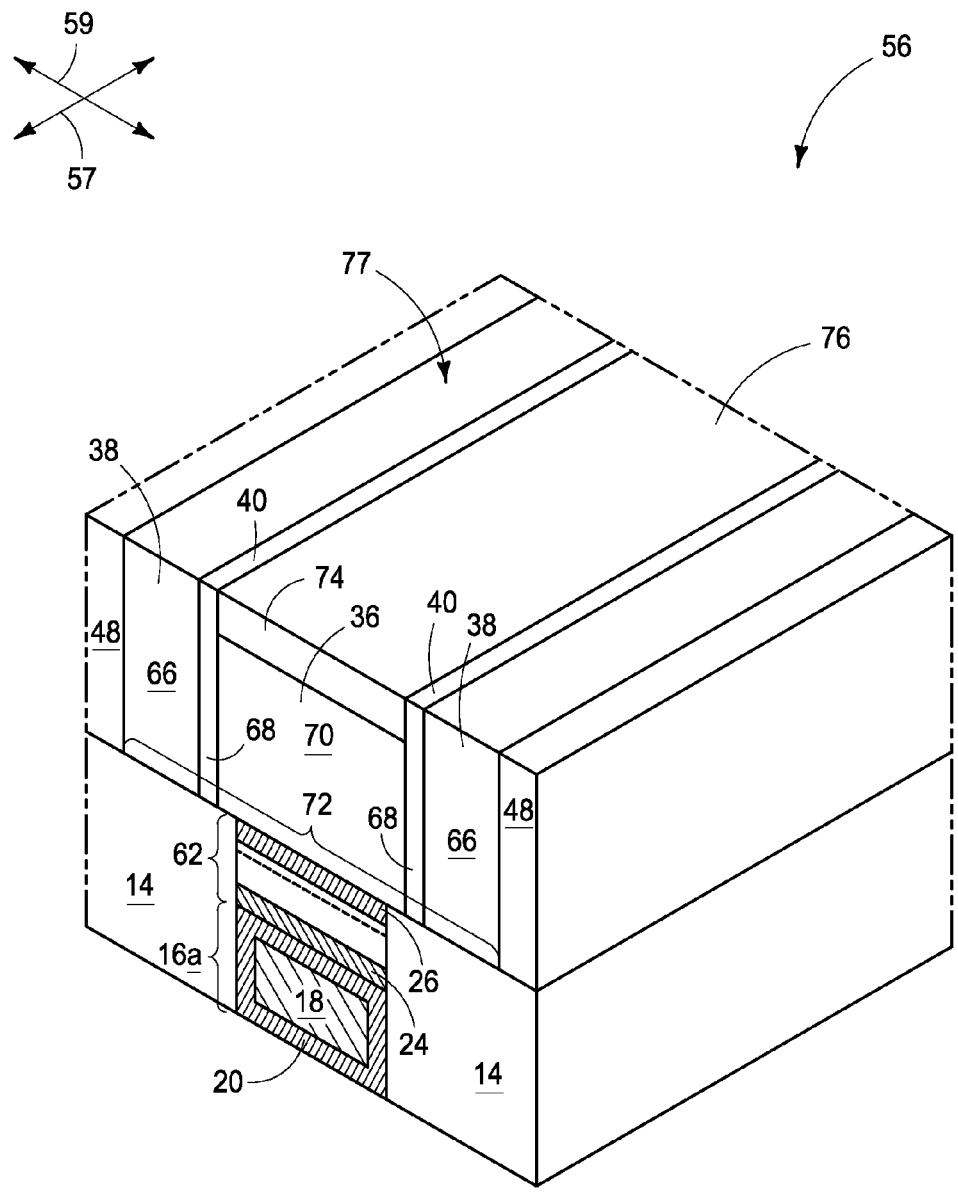

Referring to FIG. 11, electrically insulative material 74 is formed within the groove 72 (FIG. 10) and planarized (for instance, subjected to CMP) to form an electrically insulative cap 76 over the inner diode electrode 36. Material 74 may comprise any suitable composition or combination of compositions; and in some embodiments may comprise, consist essentially of, or consist of silicon nitride.

The planarization of material 74 forms a planarized surface 77 extending across materials 48, 66, 68 and 74.

Figure 12:
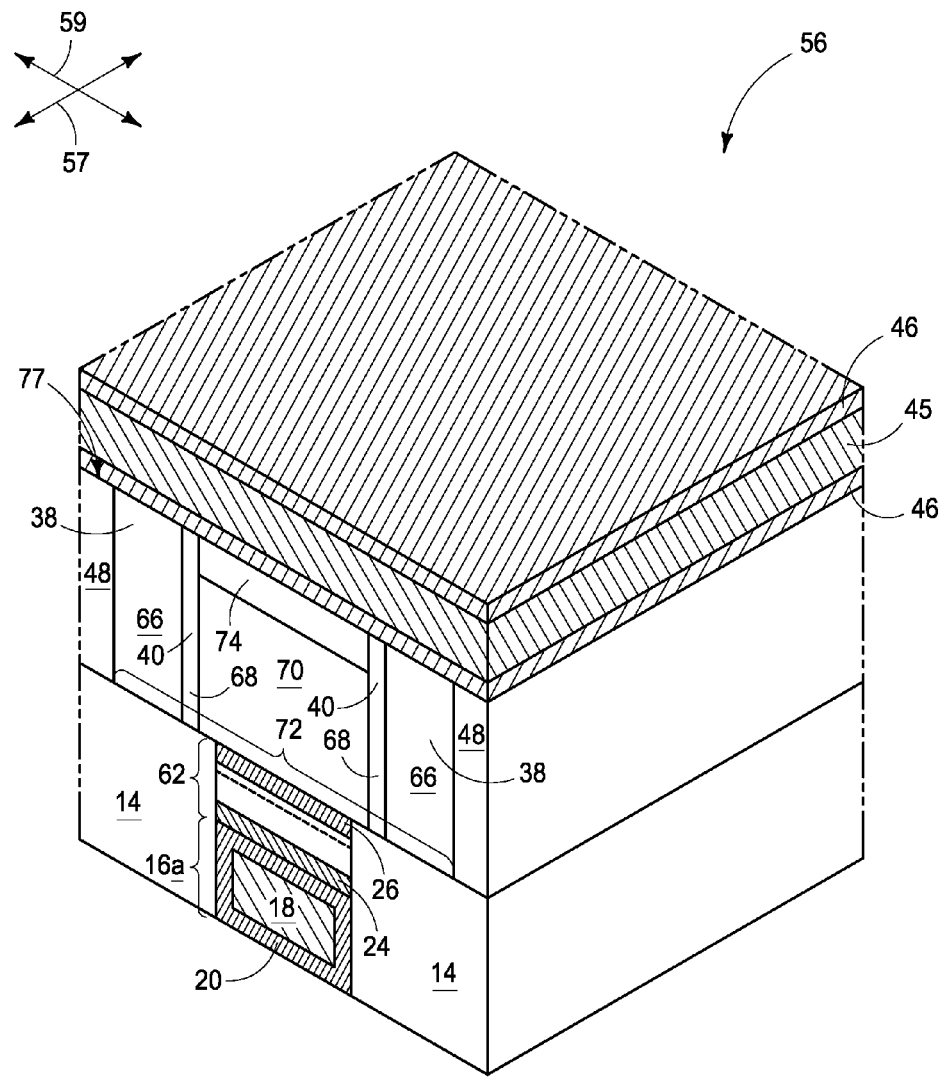

Referring to FIG. 12, electrically conductive materials 45 and 46 are formed across the planarized upper surface 77. In the shown embodiment, the electrically conductive materials correspond to the copper barrier material 46 and the copper material 45. In other embodiments, one or more other electrically conductive materials may be provided in addition to, or alternatively to, the illustrated conductive materials. The electrically conductive material 46 directly contacts outer diode electrode material 66 and intermediate diode material 68; and is spaced from inner diode electrode material 70 by the electrically insulative cap 74.

Figure 13:
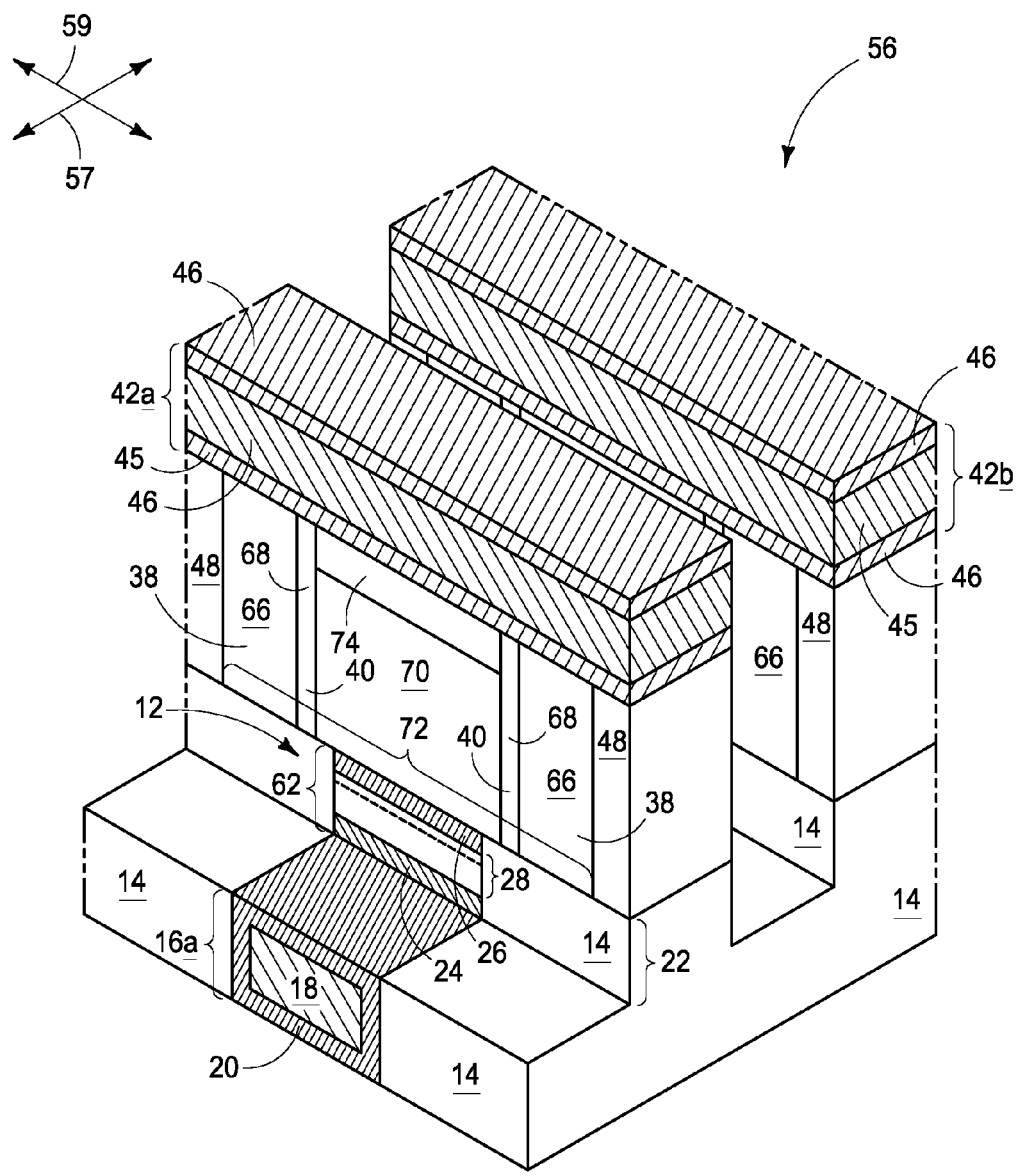

Referring to FIG. 13, the conductive materials 45 and 46 are patterned into access/sense lines 42a and 42b. The access/sense line 16a may be considered to be comprised by a first series of lines (as shown in FIG. 3), and the access/sense lines 42a and 42b may be considered to be comprised by a second series of lines that extend substantially orthogonally to the first series of lines.

In the shown embodiment, the pattern of the access/sense lines 42a and 42b is transferred through the diode materials 66, 68 and 70, and through the memory cell materials (i.e., the materials of electrodes 24 and 26, and the programmable materials 30 and 32). The first and second rails 62 and 72 at are thus etched at periodic locations, which singulates individual memory structures 12 from the rails 62 and 72.

In subsequent processing (not shown) additional copper barrier material may be formed along exposed surfaces of copper material 45; and insulative material analogous to the material 60 of FIG. 3 may be formed between the patterned diode materials and patterned access/sense lines 42a and 42b.

Although the shown embodiment transfers a pattern of access/sense lines 42a and 42b into the second rail 72, in other embodiments a separate patterning step may be utilized to pattern the materials of the second rail so that the second rail is patterned into structures which are wider than the access/sense lines above such rails. Also, in some embodiments such separate patterning step may be utilized to pattern the first rail 62 as well as the second rail 72.

Figure 14:
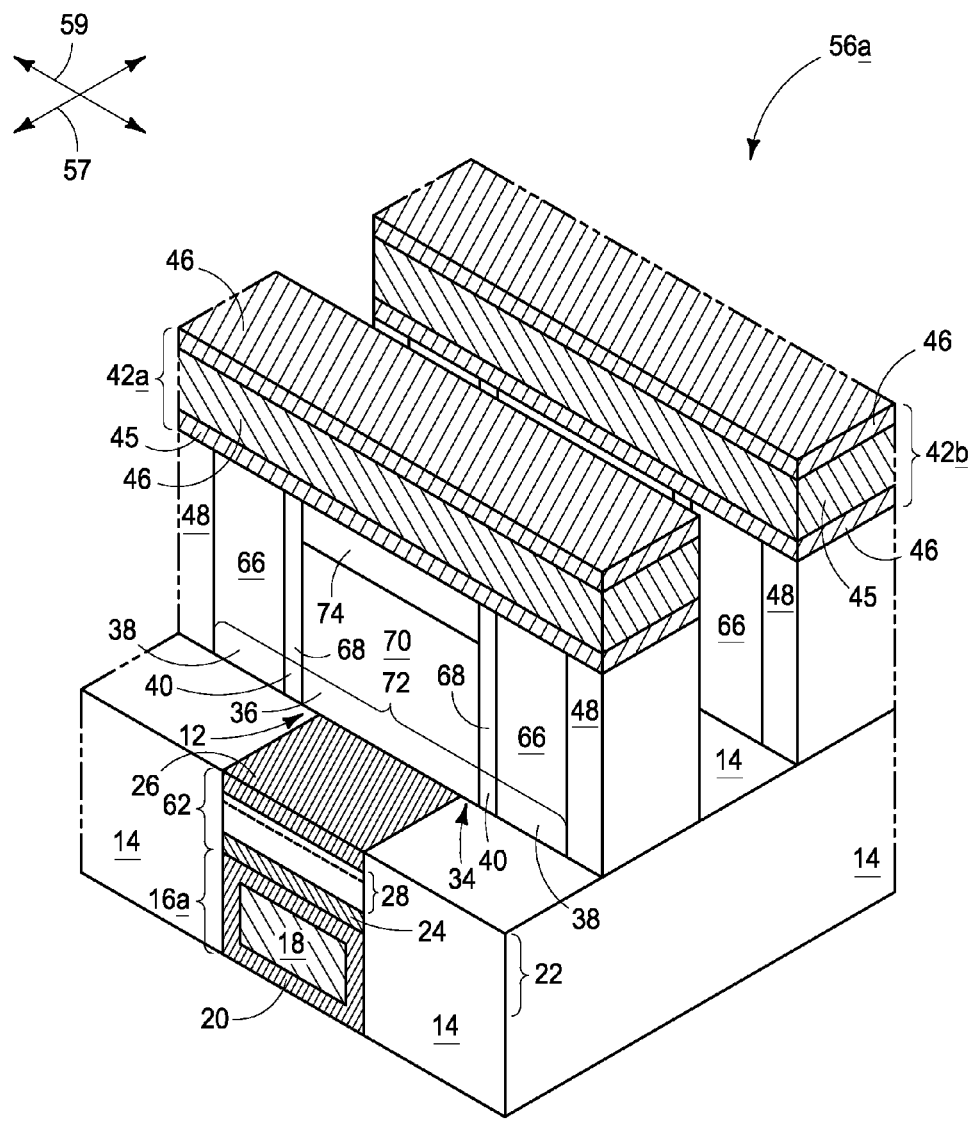
FIG. 14 is a diagrammatic three-dimensional view of a portion of a semiconductor construction comprising another example embodiment array of memory structures.

The process of FIG. 13 etched through both of the first and second rails 62 and 72. Other embodiments may comprise processing which etches only through the diode materials of the second rail 72, rather than also etching through the memory cell materials of the first rail 62. FIG. 14 shows a construction 56a at a processing stage subsequent to that of FIG. 12 in accordance with an example embodiment which etches only through rail 72 instead of through both of the rails 62 and 72.

The memory structures and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory structure. The memory structure comprises a memory cell having programmable material between a pair of electrodes. The programmable material comprises a multivalent metal oxide directly against a high-k dielectric. The memory structure also comprises a diode over the memory cell. The diode comprises a first diode electrode directly over one of the memory cell electrodes and electrically coupled with said one of the memory cell electrodes. The diode also comprises a second diode electrode laterally outward of the first diode electrode and not directly over the memory cell.

Some embodiments include a memory structure. The memory structure comprises a memory cell having programmable material between a pair of electrodes. The programmable material comprises a multivalent metal oxide directly against a high-k dielectric. The memory structure comprises a first diode electrode directly over and directly against one of the memory cell electrodes, comprises a pair of intermediate diode region segments on opposing sides of the first diode electrode, and comprises a pair of second diode electrode segments on opposing sides of the first diode electrode and laterally outward of the intermediate diode region segments. The second diode electrode segments and the intermediate diode region segments are not directly over the memory cell.

Some embodiments include a memory array. The memory array includes a first series of access/sense lines that extend primarily along a first direction, and includes a second series of access/sense lines over the first series. The lines of the second series extending primarily along a second direction that intersects the first direction. The memory array includes a plurality of memory structures between the first and second series of access/sense lines, with individual memory structures being at regions where the second series of access/sense lines overlap the first series of access/sense lines. At least some of the individual memory structures comprise a memory cell and a diode over the memory cell. The memory cell includes programmable material between a pair of electrodes; with the programmable material comprising a multivalent metal oxide directly against a high-k dielectric. The diode includes a first diode electrode directly over one of the memory cell electrodes and electrically coupled with said one of the memory cell electrodes; includes a second diode electrode, and includes an intermediate diode region between the first and second diode electrodes. The second diode electrode is laterally outward of the first diode electrode and not directly over the memory cell. The access/sense lines of the second series are directly electrically coupled with the second diode electrodes and are not directly electrically coupled with the first diode electrodes.

Some embodiments include a method of forming a memory structure. A first rail is formed, with the first rail comprising a memory cell stack. The memory cell stack includes programmable material between a pair of electrodes.

The programmable material comprises a multivalent metal oxide directly against a high-k dielectric. One of the electrodes is an uppermost memory cell electrode. A dielectric material is formed over the first rail. A trench is formed in the dielectric material directly over and along the first rail. The uppermost memory cell electrode is exposed along a bottom of the trench. An outer diode electrode material is formed within the trench, and then subjected to an anisotropic etch to form liners of the outer diode electrode material along sidewalls of the trench. The liners of the outer diode electrode material are laterally outward of the uppermost memory cell electrode so that an entirety of an upper surface of the uppermost memory cell electrode is exposed after forming the liners of the outer diode electrode material. Intermediate diode material is formed within the trench between the liners of the outer diode electrode material, and then subjected to an anisotropic etch to form liners of the intermediate diode material along the liners of the outer diode electrode material. The liners of the intermediate diode material are laterally outward of the uppermost memory cell electrode so that an entirety of the upper surface of the uppermost memory cell electrode is exposed after forming the liners of the intermediate diode material. An inner diode electrode material is formed within the trench between the liners of the intermediate diode material, and directly over and against the upper surface of the uppermost memory cell electrode. The outer diode electrode liners, intermediate diode material and inner diode electrode material together forming a second rail over the first rail. The second rails are etched at periodic locations to singulate memory structures from the first and second rails. The memory structures comprise memory cells from the first rails together with diodes from the second rails.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a memory structure, comprising:
    forming a first rail comprising a memory cell stack; the memory cell stack comprising programmable material between a pair of electrodes; the programmable material comprising a multivalent metal oxide directly against a high-k dielectric; one of the electrodes being an uppermost memory cell electrode;
    forming a dielectric material over the first rail;
    forming a trench in the dielectric material directly over and along the first rail, the uppermost memory cell electrode being exposed along a bottom of the trench;
    forming an outer diode electrode material within the trench, and then subjecting the outer diode electrode material to an anisotropic etch to form liners of the outer diode electrode material along sidewalls of the trench; the liners of the outer diode electrode material being laterally outward of the uppermost memory cell electrode so that an entirety of an upper surface of the uppermost memory cell electrode is exposed after forming the liners of the outer diode electrode material;
    forming intermediate diode material within the trench between the liners of the outer diode electrode material, and then subjecting the intermediate diode material to an anisotropic etch to form liners of the intermediate diode material along the liners of the outer diode electrode material; the liners of the intermediate diode material being laterally outward of the uppermost memory cell electrode so that an entirety of the upper surface of the uppermost memory cell electrode is exposed after forming the liners of the intermediate diode material;
    forming an inner diode electrode material within the trench between the liners of the intermediate diode material, and directly over and against the upper surface of the uppermost memory cell electrode; the outer diode electrode liners, intermediate diode material and inner diode electrode material together forming a second rail over the first rail; and
    etching through the second rail at periodic locations to singulate memory structures from the first and second rails; the memory structures comprising memory cells from the first rails together with diodes from the second rails.

2. The method of claim 1 wherein the first rail is etched at the periodic locations.

3. The method of claim 1 wherein the dielectric material comprises silicon nitride.

4. The method of claim 1 wherein the inner and outer diode electrode materials comprise metal.

5. The method of claim 4 wherein the intermediate diode material comprises doped semiconductor material.

6. The method of claim 5 wherein the doped semiconductor material is subdivided into at least one p-type domain and at least one n-type domain.

7. The method of claim 1 wherein the memory structure is one of a plurality of memory structures formed in a memory array, the method of forming the array comprising:
    forming a first access/sense line extending primarily along a first direction;
    forming the first rail directly over and directly on the first access/sense line, and forming the first and second rails to extend primarily along the first direction;
    forming an electrically insulative cap directly over the inner diode electrode material of the second rail;
    forming electrically conductive material over the second rail, the electrically conductive material directly contacting the outer diode electrode material, and being spaced from the inner diode electrode material by the electrically insulative cap;
    patterning the electrically conductive material into a plurality of second access/sense lines over the second rail; the lines of the second series extending primarily along a second direction that intersects the first direction; and
    extending the pattern of the second access/sense lines into the second rail during the etching through the second rail to thereby etch the second rail at the periodic locations.

8. The method of claim 7 wherein the first rail is etched at the periodic locations.

9. The method of claim 7 wherein the first access/sense lines comprise copper surrounded by copper barrier material.

10. The method of claim 7 wherein the electrically conductive material comprises copper barrier material, and further comprising forming copper over the copper barrier material; wherein the copper and copper barrier material are both patterned into the second access/sense lines.

11. The method of claim 7 further comprise recessing the inner diode electrode material within the trench to form a groove above the inner diode electrode material and between the intermediate diode material liners; and forming the electrically insulative cap within said groove.

12. The method of claim 11 wherein the electrically insulative cap comprises silicon nitride.

13. A method of forming a memory structure, comprising:
forming memory cell comprising a programmable material between a pair of electrodes; the programmable material comprising a multivalent metal oxide directly against a high-k dielectric;
forming a first diode electrode over and directly against one of the memory cell electrodes;
forming a pair of intermediate diode material segments on opposing sides of the first diode electrode; and
forming a pair of second diode electrode segments on opposing sides of the first diode electrode and laterally outward of the intermediate diode material segments, an entirety of the second diode electrode segments being disposed laterally outward from the memory cell.

14. The method of claim 13 wherein the forming the pair of second diode electrode segments is performed prior to the forming the first diode electrode.

15. The method of claim 13 wherein the forming the pair of intermediate diode material segments is performed after the forming the pair of second diode electrode segments.

16. The method of claim 13 wherein the intermediate diode material comprises at least one of silicon and germanium.

17. The method of claim 13 wherein the intermediate diode material comprises at least one member of the group consisting of zirconium oxide, nickel oxide, and a mixture of silicon and carbon.

18. The method of claim 13 wherein the intermediate diode material segments are disposed laterally outward from the memory cell.

19. The method of claim 13 wherein an upper surface of the first diode electrode is recessed relative to upper surfaces of the pair of second diode electrode segments.

20. The method of claim 19 further comprising forming an electrically insulative material over the first diode electrode and between the pair of intermediate diode material segments.

* * * * *